US012666886B2

(12) United States Patent
Li et al.

(10) Patent No.: US 12,666,886 B2
(45) Date of Patent: Jun. 23, 2026

(54) FLOWABLE CVD FILM DEFECT REDUCTION

(71) Applicant: Applied Materials, Inc., Santa Clara, CA (US)

(72) Inventors: Wenhui Li, San Jose, CA (US); Praket P. Jha, San Jose, CA (US); Mandar B. Pandit, Milpitas, CA (US); Man-Ping Cai, Saratoga, CA (US); Jingmei Liang, San Jose, CA (US); Michael Wenyoung Tsiang, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 597 days.

(21) Appl. No.: 17/325,764

(22) Filed: May 20, 2021

(65) Prior Publication Data

US 2022/0375747 A1     Nov. 24, 2022

(51) Int. Cl.
| | |
|---|---|
| *H10P 14/60* | (2026.01) |
| *H10P 14/692* | (2026.01) |
| *H10W 10/00* | (2026.01) |
| *H10W 10/17* | (2026.01) |

(52) U.S. Cl.
CPC ...... *H10P 14/6334* (2026.01); *H10P 14/6681* (2026.01); *H10P 14/69215* (2026.01); *H10W 10/014* (2026.01); *H10W 10/17* (2026.01)

(58) Field of Classification Search
None
See application file for complete search history.

(56) References Cited

U.S. PATENT DOCUMENTS

| | | | |
|---|---|---|---|
| 6,352,594 B2 | 3/2002 | Cook | |
| 7,524,735 B1 | 4/2009 | Gauri et al. | |
| 2012/0142192 A1 | 6/2012 | Li et al. | |
| 2013/0276707 A1 | 10/2013 | Pierreux et al. | |
| 2014/0017904 A1 | 1/2014 | Gauri et al. | |
| 2015/0179501 A1 | 6/2015 | Jhaveri et al. | |
| 2016/0194758 A1* | 7/2016 | Nemani | C23C 16/401 |
| | | | 427/527 |

(Continued)

FOREIGN PATENT DOCUMENTS

| | | |
|---|---|---|
| CN | 109166787 A | 1/2019 |
| CN | 112466794 A | 3/2021 |

(Continued)

OTHER PUBLICATIONS

PCT International Search Report and Written Opinion in PCT/US2022/029125 dated Aug. 31, 2022, 9 pages.

(Continued)

*Primary Examiner* — Kelly M Gambetta
(74) *Attorney, Agent, or Firm* — Servilla Whitney LLC

(57) ABSTRACT

Processing methods disclosed herein comprise forming a nucleation layer and a flowable chemical vapor deposition (FCVD) film on a substrate surface by exposing the substrate surface to a silicon-containing precursor and a reactant. By controlling at least one of a precursor/reactant pressure ratio, a precursor/reactant flow ratio and substrate temperature formation of miniature defects is minimized. Controlling at least one of the process parameters may reduce the number of miniature defects. The FCVD film can be cured by any suitable curing process to form a smooth FCVD film.

19 Claims, 4 Drawing Sheets

(56) References Cited

U.S. PATENT DOCUMENTS

2017/0053798 A1    2/2017   Wang et al.
2018/0294166 A1   10/2018   Mallick et al.
2021/0028013 A1    1/2021   Guo et al.
2024/0018658 A1    1/2024   Zhu et al.

FOREIGN PATENT DOCUMENTS

KR     20150048084 A    5/2015
KR      101715192 B1    3/2017
WO    2021016063 A1    1/2021

OTHER PUBLICATIONS

Thornton, John A., Annual Review of Materials Science (1977) High Rate Thick Film Growth, pp. 239-260, Telic Corporation, 1631 Colorado Avenue, Santa Monica, California 90404.
Borer, B., Sonnenfeld, Ph. Rudolf von Rohr, Institute of Process Engineering, ETH Zurich, CH-8092 Zurich, Switzerland, Surface & Coatings Technology 201 (2006), pp. 1757-1762, Influence of substrate temperature on morphology of SiOx films deposited on particles by PECVD, available online Jul. 12, 2006.
Crose, Marquis, et al., Chemical Engineering Science 136 (2015), pp. 50-61, Multiscale modeling and operation of PECVD of thin film solar cells, available online Mar. 3, 2015.
PCT International Search Report and Written Opinion in PCT/US2025/047120 dated Jan. 20, 2026, 10 pages.

* cited by examiner

300

310 — EXPOSING A SUBSTRATE SURFACE TO A SILICON-CONTAINING PRECURSOR AND A REACTANT

320 — FORMING A NUCLEATION LAYER AND A FCVD FILM ON THE SUBSTRATE SURFACE

330 — CONTROLLING AT LEAST ONE PROCESS PARAMETER

340 — CURING THE FCVD FILM

350 — HEATING THE SUBSTRATE FROM BELOW

360 — HEATING THE SUBSTRATE FROM ABOVE

370 — MAINTAINING A SPACE BETWEEN THE UPPER SURFACE AND THE SUBSTRATE SURFACE

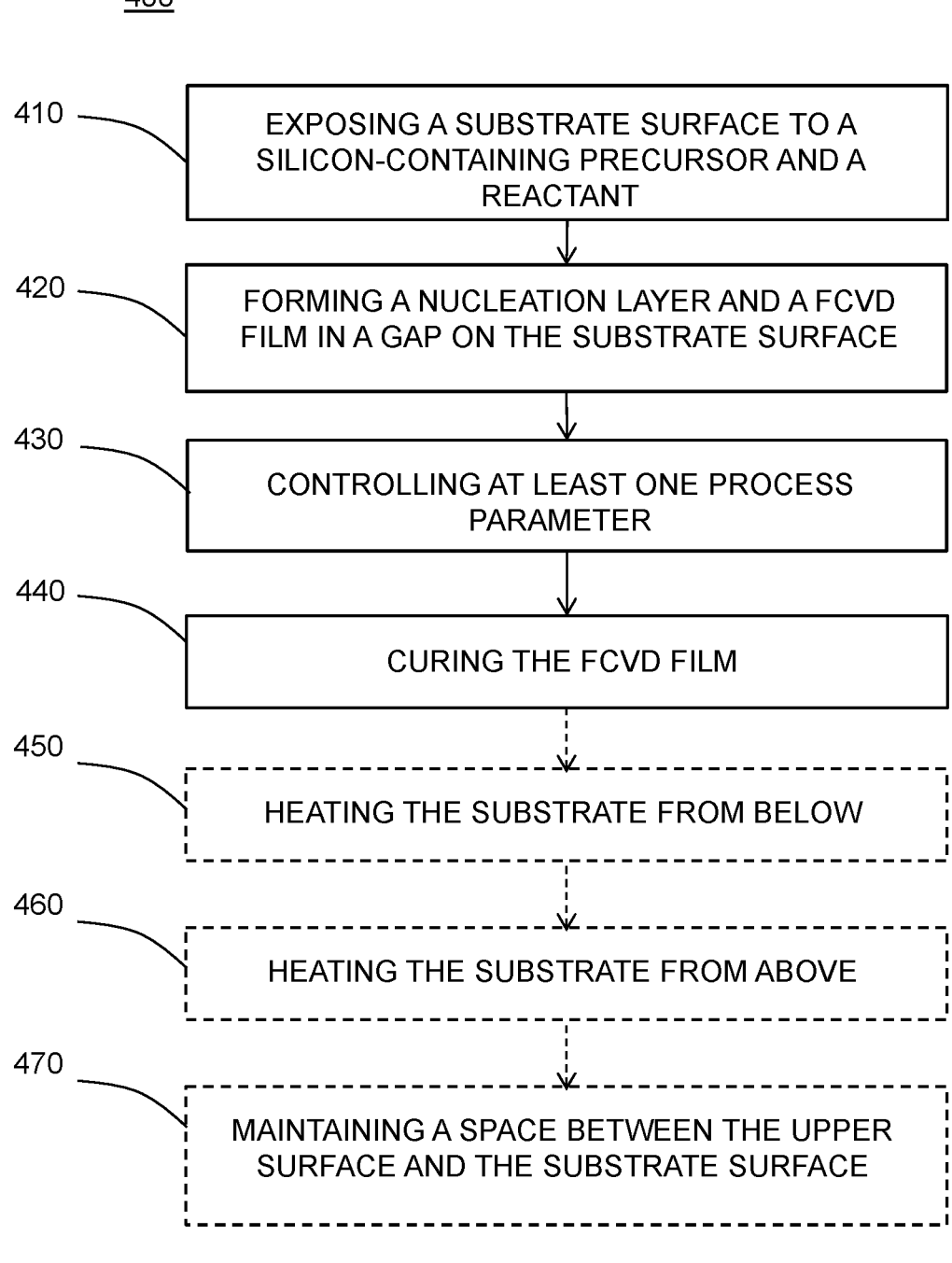

<u>400</u>

410 — EXPOSING A SUBSTRATE SURFACE TO A SILICON-CONTAINING PRECURSOR AND A REACTANT

420 — FORMING A NUCLEATION LAYER AND A FCVD FILM IN A GAP ON THE SUBSTRATE SURFACE

430 — CONTROLLING AT LEAST ONE PROCESS PARAMETER

440 — CURING THE FCVD FILM

450 — HEATING THE SUBSTRATE FROM BELOW

460 — HEATING THE SUBSTRATE FROM ABOVE

470 — MAINTAINING A SPACE BETWEEN THE UPPER SURFACE AND THE SUBSTRATE SURFACE

FIG. 4

FLOWABLE CVD FILM DEFECT REDUCTION

TECHNICAL FIELD

The present disclosure relates generally to processing methods of films. In particular, the disclosure relates to processing methods for flowable chemical vapor deposition (FCVD) thin films.

BACKGROUND

In microelectronics device fabrication, flowable chemical vapor deposition (FCVD) is used to provide a smooth substrate surface for both flat surfaces and surfaces with trenches. In particular, there is a need to fill narrow trenches having aspect ratios (AR) greater than 10:1 with no voiding for many applications. One application is for shallow trench isolation (STI). For STI applications, the film needs to be of high quality throughout the trench (having, for example, a wet etch rate ratio less than two) with very low leakage. As the dimensions of the structures decrease and the aspect ratios of the structures increase, post curing methods of the as deposited FCVD films become difficult, resulting in films with varying composition throughout the filled trench.

Conventional plasma-enhanced chemical vapor deposition (PECVD) of dielectric films form a mushroom shaped film on top of the narrow trenches. This is due to the inability of the plasma to penetrate into the deep trenches. The results in pinching-off the narrow trench from the top, which forms a void at the bottom of the trench.

Flowable chemical vapor deposition (FCVD) has been widely used in advanced generations of semiconductor devices. As feature sizes decrease, the required gap fill volume of FCVD films can be reduced greatly compared to previous nodes (e.g., <500 Å or <300 Å). It is challenging to deposit thin FCVD films having a smooth and uniform surface as well as high gap fill performance. During initial nucleation of the FCVD film, miniature defects are self-generated on the FCVD film nucleation layer. These miniature defects which can be on the order of 10 nm enlarge 4-6 times in size after annealing deposition of a liner over the FCVD film. Non-uniform initial nucleation of the FCVD film causes surface roughness. Accordingly, there is a need for methods of reducing miniature defects in FCVD films.

SUMMARY

One or more embodiments of the disclosure are directed to substrate processing methods comprising forming a nucleation layer and a flowable chemical vapor deposition (FCVD) film on a substrate surface by exposing the substrate surface to a silicon-containing precursor and a reactant; controlling at least one of a precursor/reactant pressure ratio, a precursor/reactant flow ratio and substrate temperature to minimize formation of miniature defects; and curing the FCVD film.

Additional embodiments of the disclosure are directed to processing methods comprising forming a nucleation layer and a flowable chemical vapor deposition (FCVD) film in a gap on a substrate surface by exposing the substrate surface to a silicon-containing precursor and a reactant; controlling at least one of a precursor/reactant pressure ratio, a precursor/reactant flow ratio and a substrate temperature to minimize formation of miniature defects; and curing the FCVD film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 illustrates a flow diagram of a processing method in accordance with one or more embodiments of the disclosure.

DETAILED DESCRIPTION

Figure 1:
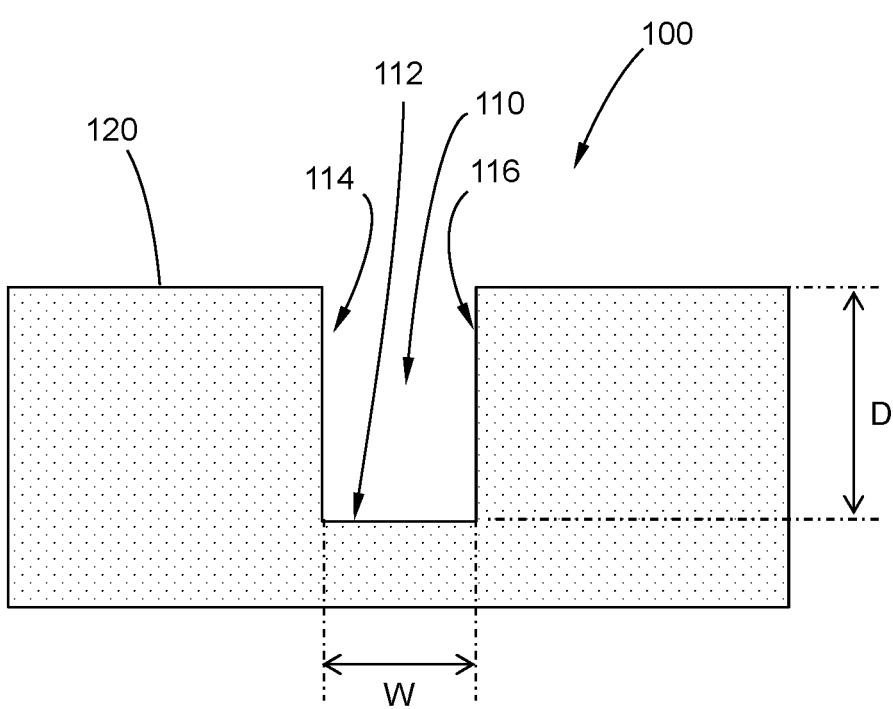
FIG. 1 shows a cross-sectional view of a substrate in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements. Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface.

Embodiments of the disclosure provide methods of improving surface roughness of a FCVD film. Some embodiments advantageously provide methods involving cyclic deposition-treatment processes that can be performed in a cluster tool environment. Some embodiments advantageously provide seam-free high quality, low roughness films that can be used to fill up high aspect ratio (AR) trenches/features with small dimensions.

In one or more embodiments, surface treatment on a substrate surface before flowable chemical vapor deposition (FCVD) advantageously improves the uniformity of initial nucleation and improves overall smoothness of the FCVD film. In one or more embodiments, plasma treatment with inert or reactive gases is found to be effective. In one or more embodiments, the plasma pre-treatment is generated by a remote plasma source (RPS) or a capacitively coupled plasma (CCP) or an inductively coupled plasma (ICP) with ambient like argon (Ar), helium (He), ammonia ($NH_3$), nitrogen ($N_2$), hydrogen ($H_2$), or their mixtures. In one or more embodiments, initial nucleation smoothness can be further improved by changing the order in which the reactants are introduced, changing the flow ratio of the reactants, and by changing the reactants retention time in the chamber during deposition.

In one or more embodiments, ending deposition of the FCVD film may enable smooth deposition of subsequent layers of material. In one or more embodiments, fast elimination of radical residues and avoiding reaction in unpreferred process regimes at the end of deposition reduces surface roughness.

One or more embodiments of the disclosure are directed to processes where FCVD films are deposited which are able to fill high aspect ratio structures (e.g., AR>8:1). Embodiments of the disclosure provide method of pre-treating a substrate surface prior to formation of a FCVD film in order to form a smooth surface.

In one or more embodiments, the disclosure provides for the deposition of FCVD films in gap fill applications, but the disclosure is not limited to gap fill applications. The deposition of FCVD films in some embodiments occurs on a flat substrate or a flat substrate surface, for example on an upper surface of a mesa. The FCVD film may deposit on the wafer (in some embodiments, the temperature of the wafer is at a temperature of from −10° C. to 200° C.) and due to flowability, polymers of the FCVD film will flow and fill pits, scratches and gaps. However, those skilled in the art will understand that the precursors and methods described are not limited to gap fill applications and can be used for any FCVD film formation. FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the substrate 100 comprises a substrate surface 120 and at least one feature 110. The at least one feature 110 forms an opening in the substrate surface 120. The at least one feature 110 extends from the substrate surface 120 to a depth D to a bottom surface 112. The at least one feature 110 has a first sidewall 114 and a second sidewall 116 that define a width W of the at least one feature 110. The open area formed by the sidewalls and bottom are also referred to as a gap.

In one or more embodiments, miniature defects may be present in the open area formed by the sidewalls and bottom. In one or more embodiments, miniature defects are self-generated on the FCVD film nucleation layer during initial nucleation. In one or more embodiments, non-uniform nucleation includes miniature defects. According to one or more embodiments, "miniature defects" refers to defects that are about 10 nm in diameter (e.g., in a range of from about 5 nm to about 15 nm). Non-uniform nucleation may cause an increase in surface roughness. In one or more embodiments, before using a substrate processing method or a processing method as described herein, a number of miniature defects may include a baseline value of up to 500 miniature defects that occur without using any of the methods described herein to control the process parameters and to reduce the number of defects. Controlling at least one of the process parameters reduces the baseline value of miniature defects to provide a reduced number of miniature defects compared to the baseline value obtained when at least one of the process parameters are not controlled as described herein. In one or more embodiments, the reduced number of miniature defects is in a range from about 0 defects to about 45 defects. In one or more embodiments, the reduced number of miniature defects is in a range from about 0 defects to about 10 defects.

In one or more embodiments, a scanning electron microscope (SEM) is used to count the number of miniature defects in the FCVD film and to measure the size of the miniature defects using an image pixel number from an SEM image of the FCVD film. In one or more embodiments, an atomic force microscope (AFM) is used measure the roughness of the FCVD film.

It has been discovered that controlling at least one of the process parameters improves uniform initial nucleation. In one or more embodiments, uniform initial nucleation reduces the number of miniature defects. One or more embodiments of the disclosure are directed to processing methods in which a substrate surface with at least one feature thereon is provided. As used in this regard, the term "provided" means that the substrate is placed into a position or environment for further processing.

Figure 2:
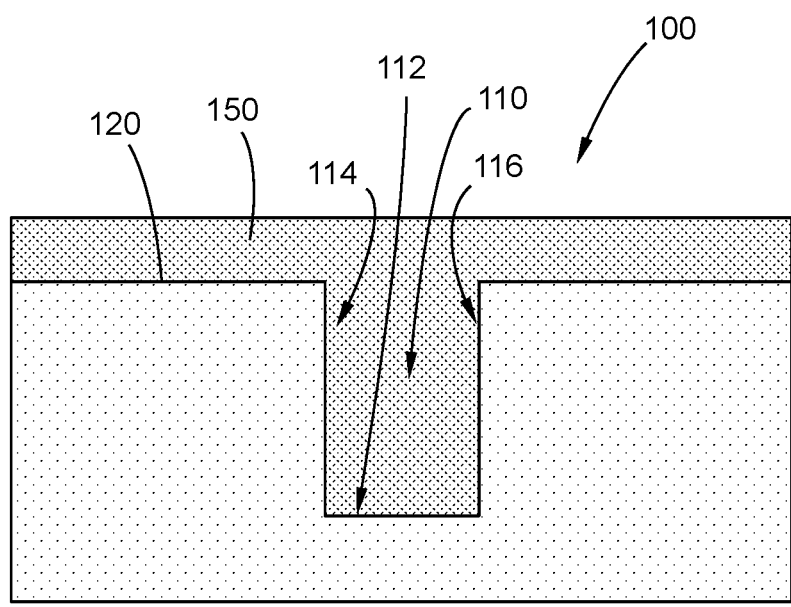
FIG. 2 shows a cross-sectional view of a substrate in accordance with one or more embodiments of the disclosure.

As shown in FIG. 2, a FCVD film 150 is formed on the substrate surface 120 and the first sidewall 114, second sidewall 116 and bottom surface 112 of the at least one feature 110. The FCVD film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

The FCVD film 150 can be formed by any suitable process. In some embodiments, the FCVD film is formed by chemical vapor deposition (CVD). In some embodiments, the FCVD film is formed by plasma-enhanced chemical vapor deposition (PECVD). Stated differently, the FCVD film can be deposited by a plasma-enhanced chemical vapor deposition (PECVD) process.

Embodiments of the disclosure advantageously provide methods of pre-treating a substrate surface to form a smooth pre-treated substrate surface that can be use in deposition of flowable CVD films. In one or more embodiments, a substrate surface is pre-treated with a plasma to form a smooth pre-treated substrate surface having chemical bondings that promote smoothness. A flowable CVD film is then formed on the pre-treated substrate surface by exposing the pre-treated substrate surface to a precursor and a reactant. The flowable CVD film is then cured.

In one or more embodiments, the plasma used to pre-treat the substrate surface comprises one or more of argon (Ar), helium (He), hydrogen ($H_2$), nitrogen ($N_2$), or ammonia ($NH_3$).

In one or more embodiments, pre-treating the substrate surface occurs at a pressure in a range of about 5 mTorr to about 100 mTorr. Pre-treating the substrate surface may occur at a temperature in a range of about 25° C. (or ambient temperature) to about 400° C.

In one or more embodiments, the flowable CVD film that is formed on the pre-treated substrate surface has at thickness in a range of about 5 nm to about 50 nm, including about 10 nm, about 15 nm, about 20 nm, about 25 nm, about 30 nm, about 35 nm, about 40 nm, or about 45 nm. In one or more embodiments, the flowable CVD film is ultra-thin and has a thickness less than or equal to about 50 nm.

Referring again to FIG. 2, the FCVD film 150 can be formed at any suitable temperature. In some embodiments, the FCVD film 150 is formed at a temperature in the range of about 10° C. to about 150° C. The temperature can be kept low to preserve the thermal budget of the device being formed. In some embodiments, forming the FCVD film occurs at a temperature less than about 300° C., 250° C., 200° C., 150° C., 100° C., 75° C., 50° C., 25° C. or 0° C.

The composition of the flowable CVD film can be adjusted by changing the composition of the reactive gas. In some embodiments, the flowable CVD film comprises one or more of silicon carbide (SiC), silicon oxycarbide (SiOC), silicon carbonitride (SiCN), silicon oxycarbonitride (SiOCN), silicon oxide (SiO) and silicon nitride (SiN). To form an oxygen containing film, the co-reactant may comprise, for example, one or more of oxygen, ozone or water. To form a nitrogen containing film, the co-reactant may comprise, for example, one or more of ammonia, hydrazine, $NO_2$ or $N_2$. To form a carbon containing film, the reactive gas may comprise, for example, one or more of propylene and acetylene. Those skilled in the art will understand that combinations of or other species can be included in the reactive gas mixture to change the composition of the flowable CVD film.

In some embodiments, the FCVD film can be doped with another element. For example, in one or more embodiments, the FCVD film may be doped with one or more of boron (B), arsenic (As), or phosphorous (P). The FCVD films can be doped with elements such as boron (B) and phosphorous (P) to improve film properties. Precursors containing boron and phosphorous can be either co-flowed with the trisilylamine (TSA) and ammonia ($NH_3$) precursors during the deposition process or can be infiltrated after the deposition is done. Boron-containing precursors can be aminoboranes/boranes compounds and phosphorous-containing precursors can be phosphate/phosphite compounds. In some embodiments, doping the FCVD film comprises co-flowing a dopant precursor with the trisilylamine (TSA) and ammonia ($NH_3$) precursors. In some embodiments, doping the FCVD film comprises implantation of the dopant element in a separate process.

Figure 3:
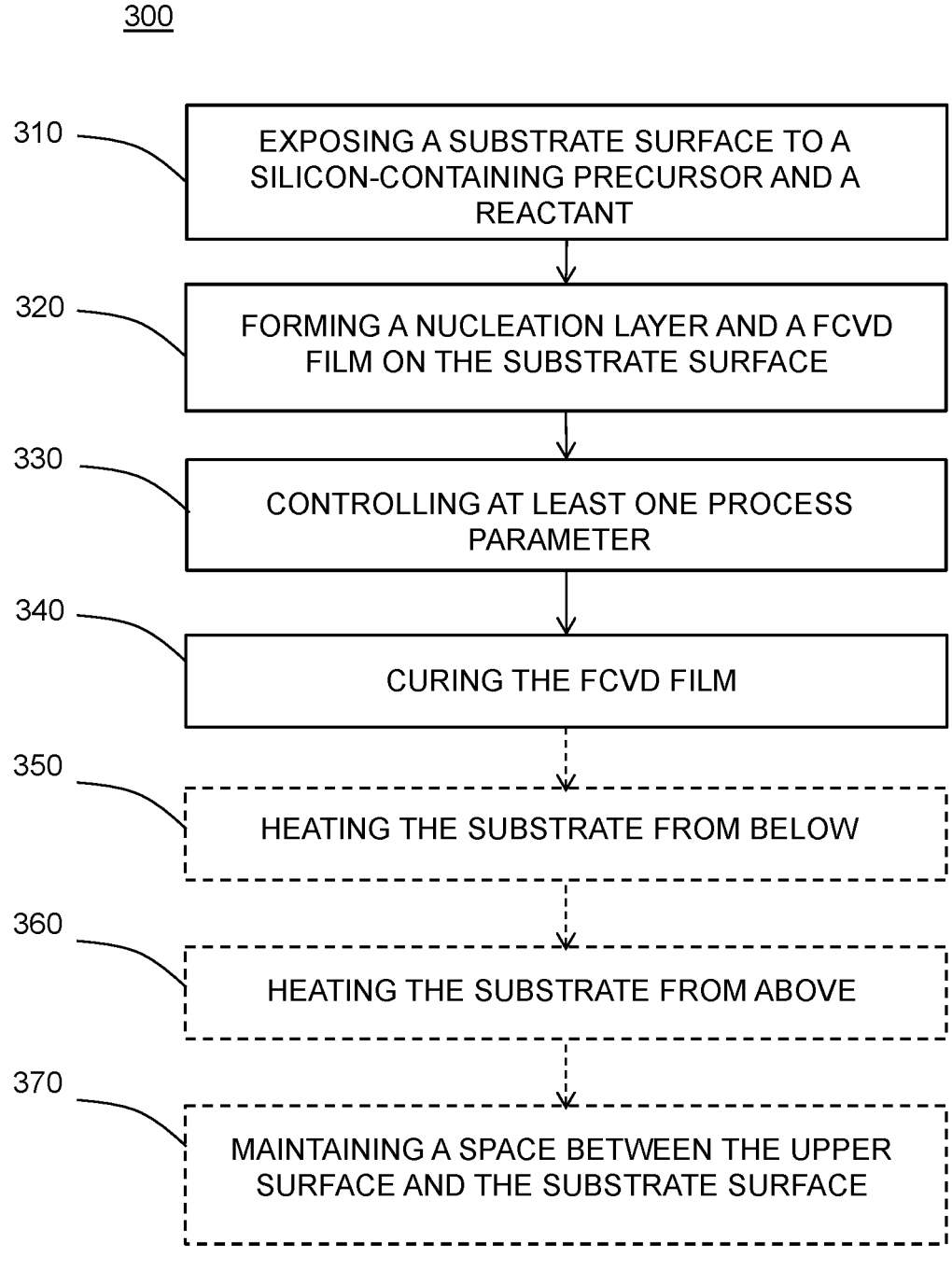
FIG. 3 illustrates a flow diagram of a substrate processing method in accordance with one or more embodiments of the disclosure.

Referring now to FIG. 3, an exemplary embodiment of a substrate processing method is shown. The method 300 comprises forming a nucleation layer and a flowable chemical vapor deposition (FCVD) film on a substrate surface at operation 320, by exposing the substrate surface to a silicon-containing precursor and a reactant at operation 310. The method 300 further comprises at operation 330 controlling at least one process parameter. As used herein, "process parameter" includes at least one of a precursor/reactant pressure ratio, a precursor/reactant flow ratio and substrate temperature. The method 300 comprises at operation 340 curing the FCVD film.

In one or more embodiments, the precursor comprises trisilylamine (TSA). In one or more embodiments, the reactant comprises ammonia ($NH_3$). In some embodiments, the trisilylamine (TSA) precursor can be used with another precursor (e.g., co-flow with another Si-containing precursor) in a flowable process to deposit films of various compositions. As an example, precursors containing silicon and hydrocarbon groups can be used with the trisilylamine (TSA)/$NH_3$ process to incorporate carbon into the FCVD film. In one or more embodiments, the FCVD films obtained from TSA/$NH_3$ process are either SiO or SiN films. By the addition of a precursor containing carbon and silicon, SiOC, SiCON or SiCN films can be deposited.

In one or more embodiments, the trisilylamine (TSA) precursor may be vaporized delivered to a CVD chamber, and a suitable co-reactant (e.g., ammonia ($NH_3$), oxygen ($O_2$), carbon dioxide ($CO_2$), carbon monoxide (CO), argon (Ar), helium (He), hydrogen ($H_2$), or any combination thereof) can be delivered to the chamber through, for example, a remote plasma source (RPS), which will generate plasma active species as the co-reactants. Plasma activated co-reactant molecules (radicals) have high energies and may react with trisilylamine (TSA) precursor molecules in the gas phase to form corresponding flowable polymers. In some embodiments, the plasma is generated with a plasma gas that comprises one or more of $NH_3$, $O_2$, $CO_2$, CO, Ar, He, or $H_2$.

In one or more embodiments, the plasma can be generated or ignited within the processing chamber (e.g., a direct plasma) or can be generated outside of the processing chamber and flowed into the processing chamber (e.g., a remote plasma).

In one or more embodiments, exposing the substrate surface to a silicon-containing precursor and a reactant includes flowing one or more of a carrier gas selected from the group consisting of argon (Ar), helium (He), oxygen ($O_2$) and combinations thereof.

In some embodiments, the processing method further comprises eliminating oxygen ($O_2$) from the substrate environment and turning off the flow of ammonia ($NH_3$), while continuing to flow triysilylamine (TSA) over the treated substrate with FCVD deposition. Without intending to be bound by theory, it is thought that surface roughness of the FCVD film is improved with this termination process.

In other embodiments, exposing the substrate surface is conducted substantially in the absence of oxygen ($O_2$). Stated differently, in one or more embodiments the substrate surface is substantially free of oxygen ($O_2$) when TSA and $NH_3$ are flowed over the substrate surface. As used herein, the term "substantially in the absence of" or the term "substantially free of" means that there is less than 5%, including less than 4%, less than 3%, less than 2%, less than 1%, and less than 0.5% of oxygen present in the atmosphere surrounding the substrate surface.

In one or more embodiments, exposing the substrate surface is conducted in the presence of oxygen ($O_2$). In one or more embodiments, oxygen ($O_2$) is present for the formation of silicon oxide ($SiO_x$) films. In one or more embodiments, ammonia ($NH_3$) is present for the formation of silicon nitride ($SiN_x$) films.

In one or more embodiments, flowing argon (Ar) includes flowing at least about 1500 sccm of argon (Ar). In one or more embodiments, flowing argon (Ar) includes flowing not more than about 4000 sccm of argon (Ar).

In one or more embodiments, flowing helium (He) includes flowing at least about 2400 sccm of helium (He). In one or more embodiments, flowing helium (He) includes flowing not more than about 5000 sccm of helium (He).

In one or more embodiments, flowing oxygen ($O_2$) includes flowing at least about 5 sccm of oxygen ($O_2$). In one or more embodiments, flowing oxygen ($O_2$) includes flowing not more than about 500 sccm of oxygen ($O_2$). In one or more embodiments, flowing oxygen ($O_2$) includes flowing about 200 sccm of oxygen ($O_2$).

In one or more embodiments, the precursor/reactant pressure is in a range from about 0.35 Torr to about 0.8 Torr. In one or more embodiments, the precursor/reactant pressure is in a range from about 0.4 Torr to about 0.65 Torr. In one or more embodiments, the precursor/reactant pressure is in a range from about 0.45 Torr to about 0.5 Torr.

In one or more embodiments, the precursor/reactant flow ratio is a flow ratio of $TSA/NH_3$. In one or more embodiments, the flow ratio of $TSA/NH_3$ is in a range of from 15/1 to 50/1. In one or more embodiments, the precursor/reactant flow ratio of $TSA/NH_3$ is in a range of from 16/1 to 49/1, in a range of from 17/1 to 48/1, in a range of from 18/1 to 47/1, in a range of from 19/1 to 46/1, in a range of from 20/1 to 45/1, in a range of from 21/1 to 44/1, in a range of from 22/1 to 43/1, in a range of from 23/1 to 42/1, in a range of from 24/1 to 41/1, in a range of from 25/1 to 40/1, in a range of from 26/1 to 39/1, in a range of from 27/1 to 38/1, in a range of from 28/1 to 37/1, in a range of from 29/1 to 36/1, in a range of from 30/1 to 35/1, in a range of from 31/1 to 34/1, or in a range of from 32/1 to 33/1.

In one or more embodiments, curing the FCVD film solidifies the film and forms a substantially seam-free gap fill.

In some embodiments, curing the FCVD film comprises thermal annealing. Thermal annealing can occur at any suitable temperature and any suitable environment. In some embodiments, the FCVD film is cured by thermal annealing in an acetylene/ethylene environment.

In some embodiments, curing the FCVD film comprises exposure to a plasma or an electron beam. A plasma exposure to cure the film comprises a plasma separate from the PECVD plasma. The plasma species and processing chamber can be the same and the plasma cure is a different step than the PECVD process.

In some embodiments, curing the FCVD film comprises exposing the FCVD film to a steam anneal and/or oxygen plasma. The use of a steam anneal and/or oxygen plasma may reduce the carbon content of the FCVD film so that the cured film has a lower carbon content than the as-deposited FCVD film. The use of the steam anneal and/or oxygen plasma may convert the deposited flowable SiC, SiCN, or SiOC film to SiO.

In some embodiments, the curing the FCVD film comprises exposing the film to a UV curing process. The UV curing process can occur at a temperature in the range of about 10° C. to about 550° C. The UV curing process can occur for any suitable time frame necessary to sufficiently solidify the FCVD film. The UV cure can be performed with different parameters, e.g., power, temperature, environment. In some embodiments, the UV cure occurs in an acetylene/ethylene environment.

In one or more embodiments, the method 300 optionally includes at operation 350 heating the substrate from below the substrate, including heating a substrate support 540. In one or more embodiments, the method 300 optionally includes at operation 360 heating the substrate from above the substrate. In one or more embodiments, the method 300 optionally includes at operation 370 maintaining a space between the upper surface and the substrate surface.

In one or more embodiments, substrate processing methods as described herein further comprise heating the substrate from below, for example by heating a substrate support 540 upon which the substrate is placed in a substrate processing chamber. In one or more embodiments, the substrate support 540 comprises a pedestal. In one or more embodiments, heating the substrate from below comprises heating the substrate from below the substrate to a temperature in a range from about 20° C. to about 150° C. In one or more embodiments, heating the substrate comprises heating the substrate from below the substrate to a temperature in a range from about 30° C. to about 120° C. In one or more embodiments, heating the substrate from below the substrate comprises heating the substrate from below the substrate to a temperature in a range from about 45° C. to about 100° C. In one or more embodiments, heating the substrate from below the substrate reduces the number of miniature defects. Heating the substrate from below the substrate can use a heated substrate support 540 (e.g., a pedestal) or auxiliary heaters can be used. In exemplary embodiments, resistive heaters or radiative (e.g., lamps) heaters may be utilized.

In one or more embodiments, substrate processing methods as described herein further comprise heating the substrate from above the substrate, for example, by heating an upper surface 560 of a substrate processing chamber in which the process is performed. In one or more embodiments, the upper surface 560 includes one or more of a dome, a lid or a showerhead. In one or more embodiments, heating the substrate from above the substrate comprises heating the substrate from above the substrate to a temperature in a range from about 20° C. to about 150° C. In one or more embodiments, heating the substrate from above the substrate comprises heating the substrate from above the substrate to a temperature in a range from about 30° C. to about 120° C. In one or more embodiments, heating the substrate from above the substrate comprises heating the substrate from above the substrate to a temperature in a range from about 45° C. to about 100° C. In one or more embodiments, heating the substrate from above the substrate reduces the number of miniature defects. Heating the substrate from above the substrate can use a heated substrate support 540 or auxiliary heaters can be used. In exemplary embodiments, resistive heaters or radiative (e.g., lamps) heaters may be utilized.

In one or more embodiments, substrate processing methods as described herein further comprise maintaining a space S between the upper surface 560 and the substrate surface 520. In one or more embodiments, maintaining a space S between the upper surface 560 and the substrate surface 520 comprises maintaining a space in a range from about 2.5 inches (6.35 cm) to about 4.5 inches (11.43 cm), in a range from about 2.6 inches (6.60 cm) to about 4.4 inches (11.18 cm), in a range from about 2.7 inches (6.86 cm) to about 4.3 inches (10.92 cm), in a range from about 2.8 inches (7.11 cm) to about 4.2 inches (10.67 cm), in a range from about 2.9 inches (7.37 cm) to about 4.1 inches (10.41 cm), in a range from about 3.0 inches (7.62 cm) to about 4.0 inches (10.16 cm), in a range from about 3.1 inches (7.87 cm) to about 3.9 inches (9.91 cm), in a range from about 3.2 inches (8.13 cm) to about 3.8 inches (9.65 cm), in a range from about 3.3 inches (8.38 cm) to about 3.7 inches (9.40 cm), or in a range from about 3.4 inches (8.64 cm) to about 3.6 inches (9.14 cm). In one or more embodiments, maintaining a space S between the upper surface 560 and the substrate surface 520 reduces the number of miniature defects.

In one or more embodiments, maintaining a space S between the upper surface 560 and the substrate surface 520 comprises maintaining a space in a range from about 3.10 inches (7.87 cm) to about 3.95 inches (10.03 cm). In one or more embodiments, maintaining a space S between the upper surface 560 and the substrate surface 520 comprises maintaining a space in a range from about 3.15 inches (8.00 cm) to about 3.93 inches (9.98 cm). In one or more embodiments, maintaining a space S between the upper surface 560 and the substrate surface 520 comprises maintaining a space in a range from about 3.19 inches (8.10 cm) to about 3.92 inches (9.96 cm). In one or more embodiments, maintaining a space S between the upper surface 560 and the substrate surface 520 reduces the number of miniature defects.

In one or more embodiments, miniature defects are self-generated on the nucleation layer and the FCVD film during initial nucleation. In one or more embodiments, non-uniform nucleation includes miniature defects. In one or more embodiments, non-uniform nucleation may cause an increase in surface roughness. In one or more embodiments, before using a substrate processing method or a processing method as described herein, a number of miniature defects may include a baseline value of up to 500 miniature defects obtained when the process parameters described herein are not utilized. In one or more embodiments, controlling at least one of the process parameters reduces the number of miniature defects compared to the baseline value obtained without controlling at least one of the process parameters as described herein. In one or more embodiments, the number of miniature defects is in a range from about 0 defects to about 45 defects. In one or more embodiments, the number of miniature defects is in a range from about 0 defects to about 10 defects.

As used herein, a miniature defect is a defect in a range from about 5 nm to about 15 nm in diameter. In one or more embodiments, a scanning electron microscope (SEM) is used to count the number of miniature defects in the FCVD film and to measure the size of the miniature defects using an image pixel number from an SEM image of the FCVD film. In one or more embodiments, an atomic force microscope (AFM) is used to measure the roughness of the FCVD film.

In one or more embodiments, controlling at least one of the process parameters improves uniform initial nucleation. In one or more embodiments, uniform initial nucleation reduces the number of miniature defects.

Referring now to FIG. 4, an exemplary embodiment of a processing method is shown. The method 400 comprises at operation 420 forming a nucleation layer and a flowable chemical vapor deposition (FCVD) film in a gap on a substrate surface in a CVD processing chamber including a substrate support 540 and an upper surface 560 by, at operation 410, exposing the substrate surface to a silicon-containing precursor and a reactant. The method 400 comprises at operation 430 controlling at least one process parameter. As used herein, "process parameter" includes at least one of a precursor/reactant pressure ratio, a precursor/ reactant flow ratio and substrate temperature. The method 400 comprises at operation 400 curing the FCVD film.

In one or more embodiments, the precursor comprises trisilylamine (TSA). In one or more embodiments, the reactant comprises ammonia ($NH_3$). In some embodiments, the trisilylamine (TSA) precursor can be used with another precursor (e.g., co-flow with another Si-containing precursor) in a flowable process to deposit films of various compositions. As an example, precursors containing silicon and hydrocarbon groups can be used with the trisilylamine (TSA)/$NH_3$ process to incorporate carbon into the FCVD film. In one or more embodiments, the FCVD films obtained from TSA/$NH_3$ process are either SiO or SiN films. By the addition of a precursor containing carbon and silicon, SiOC, SiCON or SiCN films can be deposited.

In one or more embodiments, the trisilylamine (TSA) precursor may be vaporized to a CVD chamber, and a suitable co-reactant (e.g., ammonia ($NH_3$), oxygen ($O_2$), carbon dioxide ($CO_2$), carbon monoxide (CO), argon (Ar), helium (He), hydrogen ($H_2$), or any combination thereof) can be delivered to the chamber through, for example, a remote plasma source (RPS), which will generate plasma active species as the co-reactants. Plasma activated co-reactant molecules (radicals) have high energies and may react with trisilylamine (TSA) precursor molecules in the gas phase to form corresponding flowable polymers. In some embodiments, the plasma is generated with a plasma gas that comprises one or more of $NH_3$, $O_2$, $CO_2$, CO, Ar, He, or $H_2$.

In one or more embodiments, the plasma can be generated or ignited within the processing chamber (e.g., a direct plasma) or can be generated outside of the processing chamber and flowed into the processing chamber (e.g., a remote plasma).

In one or more embodiments, exposing the substrate surface to a silicon-containing precursor and a reactant includes flowing one or more of a carrier gas selected from the group consisting of argon (Ar), helium (He), oxygen ($O_2$) and combinations thereof.

In some embodiments, the processing method further comprises eliminating oxygen ($O_2$) from the substrate environment and turning off the flow of ammonia ($NH_3$), while continuing to flow triysilylamine (TSA) over the pre-treated substrate with FCVD deposition. Without intending to be bound by theory, it is thought that surface roughness of the FCVD film is improved with this termination process.

In other embodiments, exposing the substrate surface is conducted substantially in the absence of oxygen ($O_2$). Stated differently, in one or more embodiments the substrate surface is substantially free of oxygen ($O_2$) when TSA and $NH_3$ are flowed over the substrate surface. As used herein, the term "substantially in the absence of" or the term "substantially free of" means that there is less than 5%, including less than 4%, less than 3%, less than 2%, less than 1%, and less than 0.5% of oxygen present in the atmosphere surrounding the substrate surface.

In one or more embodiments, exposing the substrate surface is conducted in the presence of oxygen ($O_2$). In one or more embodiments, oxygen ($O_2$) is present for the formation of silicon oxide ($SiO_x$) films. In one or more embodiments, ammonia ($NH_3$) is present for the formation of silicon nitride ($SiN_x$) films.

In one or more embodiments, flowing argon (Ar) includes flowing at least about 1500 sccm of argon (Ar). In one or more embodiments, flowing argon (Ar) includes flowing not more than about 4000 sccm of argon (Ar).

In one or more embodiments, flowing helium (He) includes flowing at least about 2400 sccm of helium (He). In one or more embodiments, flowing helium (He) includes flowing not more than about 5000 sccm of helium (He).

In one or more embodiments, flowing oxygen ($O_2$) includes flowing at least about 5 sccm of oxygen ($O_2$). In one or more embodiments, flowing oxygen ($O_2$) includes flowing not more than about 500 sccm of oxygen ($O_2$). In one or more embodiments, flowing oxygen ($O_2$) includes flowing about 200 sccm of oxygen ($O_2$).

In one or more embodiments, the precursor/reactant pressure is in a range from about 0.35 Torr to about 0.8 Torr. In one or more embodiments, the precursor/reactant pressure is in a range from about 0.4 Torr to about 0.65 Torr. In one or more embodiments, the precursor/reactant pressure is in a range from about 0.45 Torr to about 0.5 Torr.

In one or more embodiments, the precursor/reactant flow ratio of TSA/$NH_3$ is in a range of from 15/1 to 50/1. In one or more embodiments, the precursor/reactant flow ratio of TSA/$NH_3$ is in a range of from 16/1 to 49/1, in a range of from 17/1 to 48/1, in a range of from 18/1 to 47/1, in a range of from 19/1 to 46/1, in a range of from 20/1 to 45/1, in a range of from 21/1 to 44/1, in a range of from 22/1 to 43/1, in a range of from 23/1 to 42/1, in a range of from 24/1 to 41/1, in a range of from 25/1 to 40/1, in a range of from 26/1 to 39/1, in a range of from 27/1 to 38/1, in a range of from 28/1 to 37/1, in a range of from 29/1 to 36/1, in a range of from 30/1 to 35/1, in a range of from 31/1 to 34/1, or in a range of from 32/1 to 33/1.

In one or more embodiments, curing the FCVD film solidifies the film and forms a substantially seam-free gap fill.

In some embodiments, curing the FCVD film comprises thermal annealing. Thermal annealing can occur at any suitable temperature and any suitable environment. In some embodiments, the FCVD film is cured by thermal annealing in an acetylene/ethylene environment.

In some embodiments, curing the FCVD film comprises exposure to a plasma or an electron beam. A plasma exposure to cure the film comprises a plasma separate from the PECVD plasma. The plasma species and processing chamber can be the same and the plasma cure is a different step than the PECVD process.

In some embodiments, curing the FCVD film comprises exposing the FCVD film to a steam anneal and/or oxygen plasma. The use of a steam anneal and/or oxygen plasma may reduce the carbon content of the FCVD film so that the cured film has a lower carbon content than the as-deposited FCVD film. The use of the steam anneal and/or oxygen plasma may convert the deposited flowable SiC, SiCN, or SiOC film to SiO.

In some embodiments, curing the FCVD film comprises exposing the film to a UV curing process. The UV curing process can occur at a temperature in the range of about 10° C. to about 550° C. The UV curing process can occur for any suitable time frame necessary to sufficiently solidify the FCVD film. The UV cure can be performed with different parameters, e.g., power, temperature, environment. In some embodiments, the UV cure occurs in an acetylene/ethylene environment.

In one or more embodiments, the method 400 optionally includes at operation 450 heating the substrate from below the substrate, for example by heating a substrate support 540. In one or more embodiments, the method 400 optionally includes at operation 460 heating the substrate from above the substrate, for example by heating an upper surface 560. In one or more embodiments, the method 400 optionally includes at operation 470 maintaining a space S between the upper surface 560 and the substrate surface 520.

Figure 5:
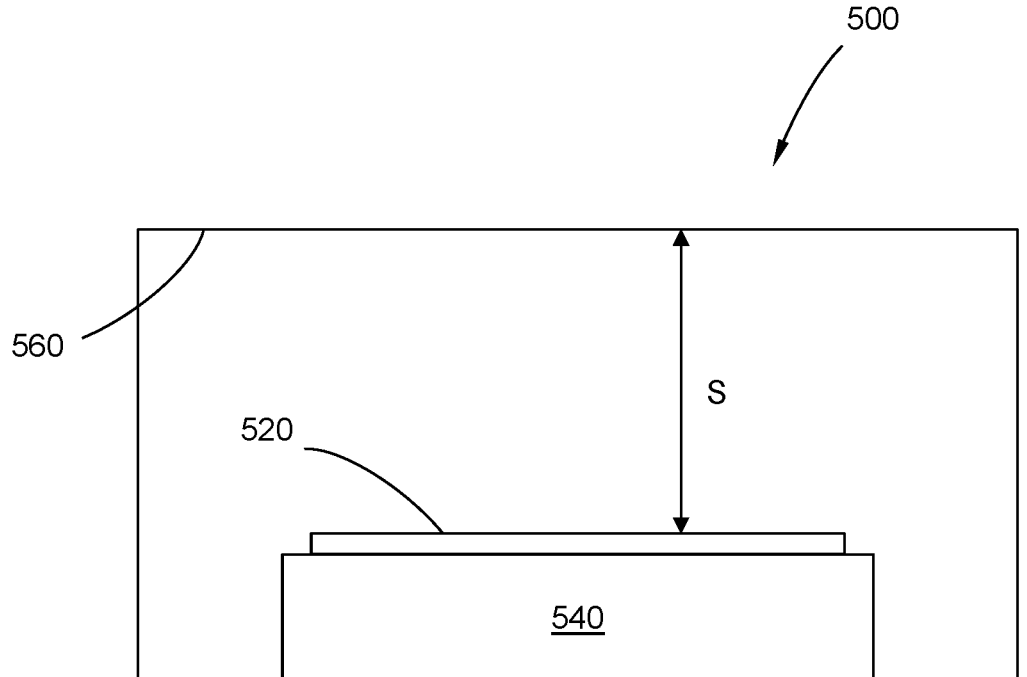
FIG. 5 illustrates a cross-sectional view of a substrate processing chamber in accordance with one or more embodiments of the disclosure.

In one or more embodiments, as shown in FIG. 5, processing methods as described herein further comprise heating the substrate support 540. In one or more embodiments, the substrate support 540 comprises a pedestal. In one or more embodiments, heating the substrate from below the substrate comprises heating the substrate from below the substrate to a temperature in a range from about 20° C. to about 150° C. In one or more embodiments, heating the substrate from below the substrate comprises heating the substrate from below the substrate to a temperature in a range from about 30° C. to about 120° C. In one or more embodiments, heating the substrate from below the substrate comprises heating the substrate from below the substrate to a temperature in a range from about 45° C. to about 100° C.

In one or more embodiments, as shown in FIG. 5, processing methods as described herein further comprise heating the upper surface 560 of the substrate processing chamber 500. In one or more embodiments, the upper surface 560 of the substrate processing chamber 500 includes one or more of a dome, a lid or a showerhead. In one or more embodiments, heating the substrate from above the substrate comprises heating the substrate from above the substrate to a temperature in a range from about 20° C. to about 150° C. In one or more embodiments, heating the substrate from above the substrate comprising heating the substrate from above the substrate to a temperature in a range from about 30° C. to about 120° C. In one or more embodiments, heating the substrate from above the substrate comprising heating the substrate from above the substrate to a temperature in a range from about 45° C. to about 100° C.

In one or more embodiments, substrate processing methods as described herein further comprise maintaining a space S between the upper surface 560 and the substrate surface 520 surface 520. In one or more embodiments, maintaining a space S between the upper surface 560 and the substrate surface 520 comprises maintaining a space in a range from about 2.5 inches (6.35 cm) to about 4.5 inches (11.43 cm), in a range from about 2.6 inches (6.60 cm) to about 4.4 inches (11.18 cm), in a range from about 2.7 inches (6.86 cm) to about 4.3 inches (10.92 cm), in a range from about 2.8 inches (7.11 cm) to about 4.2 inches (10.67 cm), in a range from about 2.9 inches (7.37 cm) to about 4.1 inches (10.41 cm), in a range from about 3.0 inches (7.62 cm) to about 4.0 inches (10.16 cm), in a range from about 3.1 inches (7.87 cm) to about 3.9 inches (9.91 cm), in a range from about 3.2 inches (8.13 cm) to about 3.8 inches (9.65 cm), in a range from about 3.3 inches (8.38 cm) to about 3.7 inches (9.40 cm), or in a range from about 3.4 inches (8.64 cm) to about 3.6 inches (9.14 cm).

In one or more embodiments, maintaining a space S between the upper surface 560 and the substrate surface 520 comprises maintaining a space in a range from about 3.10 inches (7.87 cm) to about 3.95 inches (10.03 cm). In one or more embodiments, maintaining a space S between the upper surface and the substrate comprises maintaining a space in a range from about 3.15 inches (8.00 cm) to about 3.93 inches (9.98 cm). In one or more embodiments, maintaining a space S between the upper surface and the substrate comprises maintaining a space in a range from about 3.19 inches (8.10 cm) to about 3.92 inches (9.96 cm).

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition, plasma treatment, UV curing, and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrates are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support 540 and flowing heated or cooled gases to the substrate surface. In some embodiments, the substrate support 540 includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing method comprising:
   forming a nucleation layer and a flowable chemical vapor deposition (FCVD) film on a substrate surface by exposing the substrate surface to a silicon-containing precursor comprising trisilylamine (TSA) and a reactant comprising ammonia ($NH_3$);
   controlling a silicon-containing precursor/reactant flow ratio during forming the nucleation layer to reduce formation of miniature defects in the nucleation layer, wherein the silicon-containing precursor/reactant flow ratio is controlled in a range of from 20/1 to 50/1; and
   curing the FCVD film.

2. The method of claim 1, wherein the FCVD film comprises silicon oxide.

3. The method of claim 1, wherein the miniature defects have a diameter in a range of 5 nm to 15 nm.

4. The method of claim 1, wherein controlling the silicon-containing precursor/reactant flow ratio reduces non-uniform initial nucleation during forming the nucleation layer.

5. The method of claim 1, wherein the silicon-containing precursor/reactant flow ratio is controlled in a range of from 25/1 to 50/1.

6. The method of claim 1, further comprising heating the substrate from below the substrate to a temperature in a range from about 20° C. to about 150° C.

7. The method of claim 6, wherein the substrate is on a pedestal during heating.

8. The method of claim 1, further comprising heating the substrate from above the substrate to a temperature in a range from about 20° C. to about 150° C.

9. The method of claim 8, wherein heating the substrate from above the substrate comprises heating an upper surface of a substrate processing chamber.

10. The method of claim 1, wherein exposing the substrate surface to a silicon-containing precursor and a reactant includes flowing one or more of a carrier gas selected from the group consisting of argon (Ar), helium (He), oxygen ($O_2$) and combinations thereof.

11. The method of claim 10, wherein flowing helium (He) includes flowing at least about 2400 sccm of helium (He).

12. The method of claim 10, wherein flowing oxygen ($O_2$) includes flowing at least about 5 sccm of oxygen ($O_2$).

13. The method of claim 9, further comprising maintaining a space between the upper surface and the substrate surface comprising maintaining a space in a range from about 2.5 inches (6.35 cm) to about 4.5 inches (11.43 cm).

14. The method of claim 13, comprising maintaining a space in a range from about 3.10 inches (7.87 cm) to about 3.95 inches (10.03 cm).

15. A processing method comprising:

forming a nucleation layer and a flowable chemical vapor deposition (FCVD) film in a gap on a substrate surface by exposing the substrate surface to a silicon-containing precursor comprising trisilylamine (TSA) and a reactant comprising one or more of ammonia ($NH_3$), hydrazine, $NO_2$ and $N_2$;

controlling a precursor/reactant flow ratio during forming the nucleation layer in a range of from 30/1 to 50/1 to reduce formation of miniature defects; and curing the FCVD film.

16. The method of claim 15, wherein the FCVD film comprises silicon oxide.

17. The method of claim 15, wherein the reactant comprises ammonia ($NH_3$).

18. The method of claim 15, further comprising maintaining a space between an upper surface and the substrate surface comprising maintaining a space in a range from about 2.5 inches (6.35 cm) to about 4.5 inches (11.43 cm).

19. The method of claim 18, further comprising maintaining a space in a range from about 3.10 inches (7.87 cm) to about 3.95 inches (10.03 cm).

* * * * *